United States Patent [19]

Ordway

[11] Patent Number: 4,934,946

[45] Date of Patent: Jun. 19, 1990

[54] FLEXIBLE CIRCUIT CONNECTION ASSEMBLY

[75] Inventor: Michael D. Ordway, Phoenix, Ariz.

[73] Assignee: ITT Corporation, New York, N.Y.

[21] Appl. No.: 354,592

[22] Filed: May 22, 1989

[51] Int. Cl.$^5$ ............................................... H01R 9/07
[52] U.S. Cl. ..................................... 439/77; 439/495; 439/923
[58] Field of Search ..................... 439/67, 77, 492–499, 439/923; 361/398; 174/117 F, 117 FF, 88 R

[56] References Cited

U.S. PATENT DOCUMENTS

| | | | |
|---|---|---|---|
| 2,937,357 | 5/1960 | Kennedy | 439/633 |
| 3,074,043 | 1/1963 | Stearns et al. | 439/77 |
| 3,806,767 | 4/1974 | Lehrfeld | 361/398 |
| 4,111,510 | 9/1978 | Zurcher | 439/67 |
| 4,116,516 | 9/1978 | Griffin | 439/67 |
| 4,116,517 | 9/1978 | Selvin et al. | 439/67 |
| 4,125,310 | 11/1978 | Reardon, II et al. | 439/67 |
| 4,251,683 | 2/1981 | Oughton et al. | 174/117 FF |
| 4,252,389 | 2/1981 | Olsson | 439/493 |
| 4,353,372 | 10/1982 | Ayer | 174/117 FF |
| 4,743,080 | 5/1988 | Siraty | 439/492 |

OTHER PUBLICATIONS

J. E. Wittmann, Hughes Aircraft Company, "Gold Dot-A Nonconnector Approach for Flat Cable Interconnections", 1976 Connector Symposium, Oct. 20–21, 1976.

Primary Examiner—Neil Abrams
Attorney, Agent, or Firm—Thomas L. Peterson

[57] ABSTRACT

A connection assembly in which the ends of two flat cables overlap each other with bared conductive layers thereon held in resilient engagement with each other by a connector. At least one of the flat cables is capable of being withdrawn laterally from the connector. Offset polarizing pins in the connector extend through different length slots in the movable flat cable. The slots open at the end of the cable so that when the cable is withdrawn from the connector, the cable will not be torn, or resist withdrawal of the cable from the connector. A conductive shielding bead is formed on the opposed surfaces of the two halves of the connector around the contacting regions of the cables. An insulative flap is formed over the bared conductive layers on the movable cable which prevents such layers from engaging the shielding bead when the cable is withdrawn from the connector.

14 Claims, 5 Drawing Sheets

FLEXIBLE CIRCUIT CONNECTION ASSEMBLY

BACKGROUND OF INVENTION

The present invention relates generally to a circuit connection assembly and, more particularly, to such an assembly embodying at least one flexible circuit member.

Connection assemblies are known in the art in which electrical connections are made between conductors on circuit members, such as flexible flat cables, and between one flexible cable and a printed circuit board without the use of intermediate conducting contact elements. In such arrangements, typically dimples are formed in the conductive strips of the flat cable, or metallic buttons are mounted thereon, which are brought into pressure contact with the conductors on another flat cable or printed circuit board by applying pressure to the two elements such connection assemblies are disclosed in U. S. Pat. Nos. 4,116,517 and 4,125,310.

Connection assemblies of the same general type discussed above have also been utilized in arrangements which permit motion separation between the two circuit members. That is, one circuit member, typically a flat cable, is withdrawn laterally from a clamping connector and the other circuit member which are held immobile when a force is applied to the flat cable, such as may occur when the first circuit member is attached to a vehicle and the connector and mating circuit member are mounted on a fixed support. It would be desirable to provide in such an assembly an arrangement which eliminates the possibility of incorrect polarization of the circuit members when mated in the connector without increasing the resistance to separation of the movable circuit member from the fixed member.

Further, it is known in the prior art to provide a conductive EMI, RFI, EMP shield on the mating surfaces of the two halves of the connector between which the circuit members are clamped. In the conventional connection assembly, when the movable circuit member is withdrawn from the assembly upon launch, the bared conductors on such member may become shorted by the conductive shield on the connector which could impair operation of the launching mechanism. Accordingly, it would also be desirable to provide some means for preventing such shorting condition from occurring upon separation of the movable circuit member from the connector.

SUMMARY OF INVENTION

According to one aspect of the present invention there is provided a connection assembly for making electrical connection between the conductive layers of a flexible printed circuit and another circuit member in which a connector is employed for clamping overlapping ends of the circuit members together to bring bared portions of their conductive layers into electrical contact. The connector resiliently holds the contacting areas of the circuit members in engagement with each other with sufficient force to make electrical contact between the respective conductive layers on the members, but with a force sufficiently low to permit one member to be withdrawn laterally from the connector. A Polarizing arrangement is provided for locating the circuit members in the connector in the proper position. Such polarizing arrangement comprises different length slots in the flexible insulation sheet of the flexible circuit which open at the end of the circuit. Offset upstanding pins in the connector extend through the slots in the flexible circuit and corresponding openings in the other circuit member to hold them in their proper position. By this polarizing arrangement, it can be readily discerned by the person assembling the connection assembly if the two circuit members are not properly positioned in the connector. Further, the provision of the slots in the flexible circuit member decreases separation resistance of such member from the connection assembly and prevents tearing of the insulative material of the flexible cable. According to another aspect of the present invention, a flexible circuit connection assembly is provided in which the mating halves of the connector for the circuit members to be mated is provided with a conductive EMI, RFI, EMP shield. A flap is adhered to the movable, flexible circuit in a position to cover the bared conductive layers thereon upon separation from the connector. The second circuit member is assembled in the connector with its end disposed between the flexible circuit and the flap. Upon withdrawal of the flexible circuit from the connector, the flap on such circuit prevents the conductive layers thereon from engaging the conductive shield on the connector, thereby avoiding shorting of the conductive layers on the flexible circuit by such shield.

DESCRIPTION OF PREFERRED EMBODIMENTS

Figure 1:
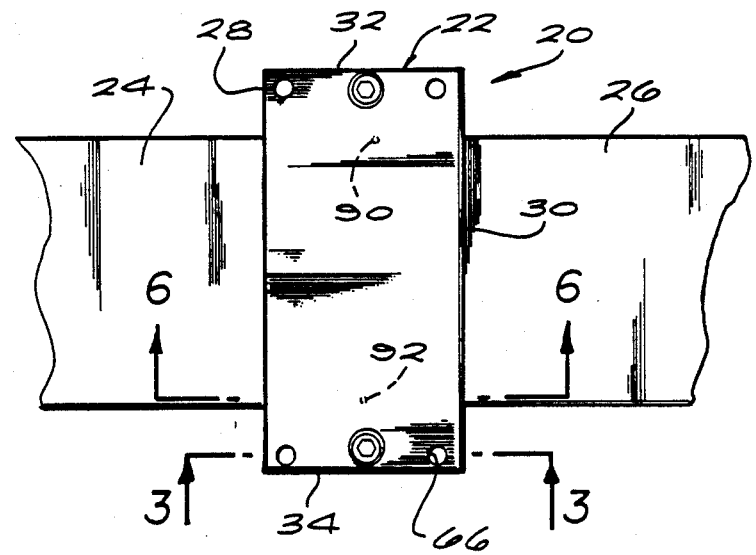
FIG. 1 is a top plan view of the connection assembly of the present invention showing two flexible circuit members mounted in the connector of the assembly.
Figure 3:
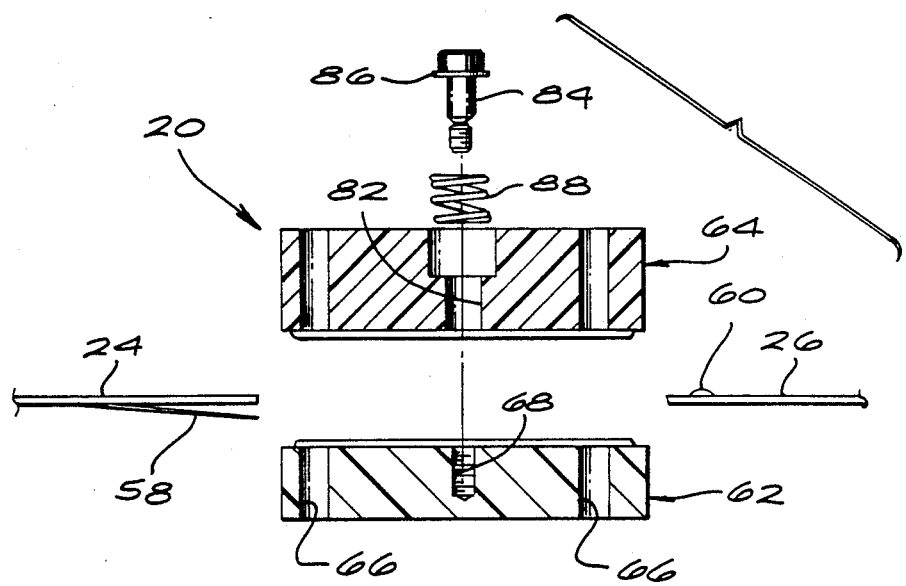
FIG. 3 is a sectional view taken along line 3—3 of FIG. 1, but showing the parts separated from each other.

Referring now to the drawings in detail, FIGS. 1 to 6 illustrate one embodiment of the flexible circuit connection assembly of the present invention, generally designated 20 The assembly comprises a connector, generally designated 22, which interconnects conductive layers on two flexible circuits 24 and 26 which may be flat cables, which are well known in the art. As seen in FIG. 1, the connector has two ends 28 and 30 and opposed sides 32 and 34. The cable 24 extends into the end 28 of the connector, while the cable 26 extends into the opposite end 30. For the purpose of this description, it will be understood that the cable 24 is the external or movable circuit member which is capable of being laterally withdrawn from the connector upon movement of a vehicle attached to the opposite end of the cable 24, while the cable 26 is the internal or fixed circuit member which, together with the connector 22, are typically secured to a fixed support not shown. While the circuit member 26 will be described specifically herein as being a flat cable, it should be understood that it also could be in the form of a rigid or semi-rigid printed circuit board.

Figure 2:
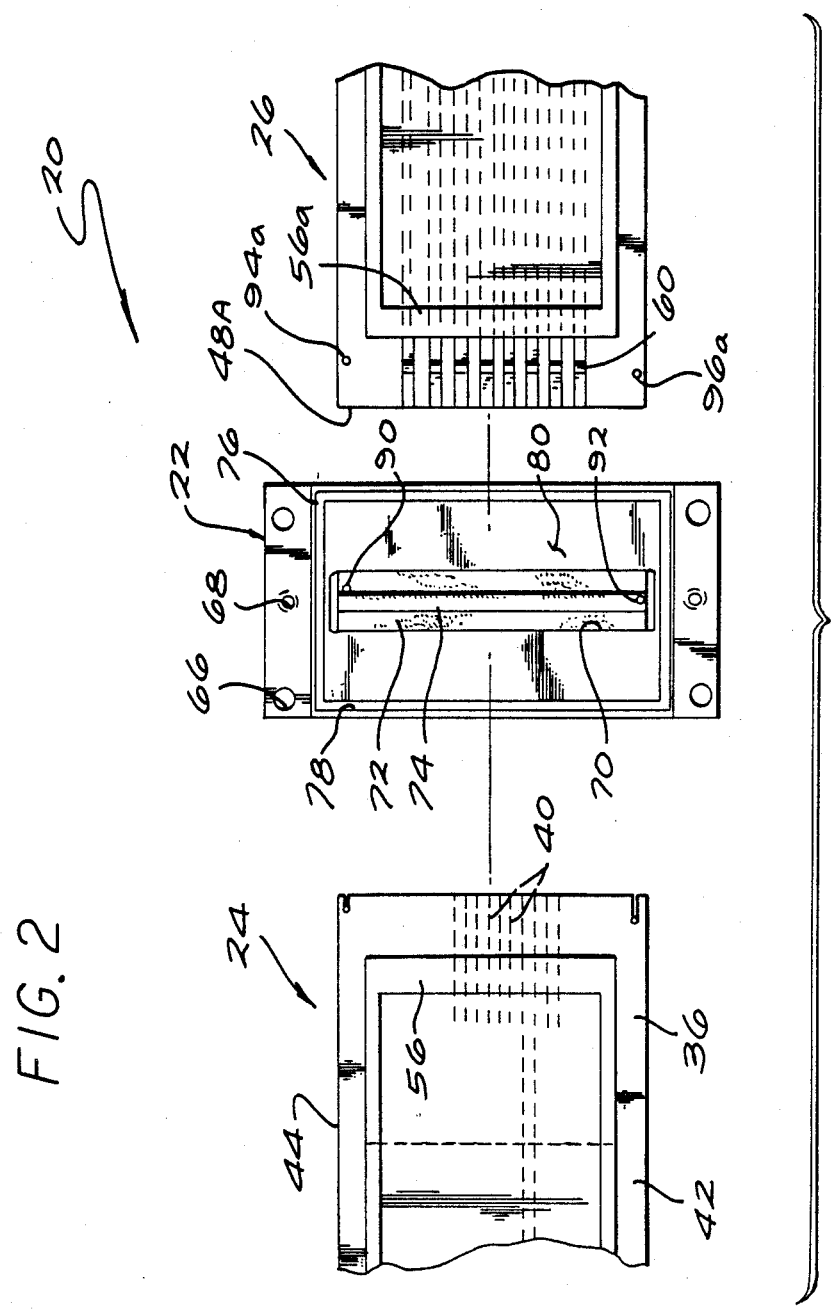
FIG. 2 is an exploded view of the assembly illustrated in FIG. 1, with the cover of the connector removed.
Figure 4:
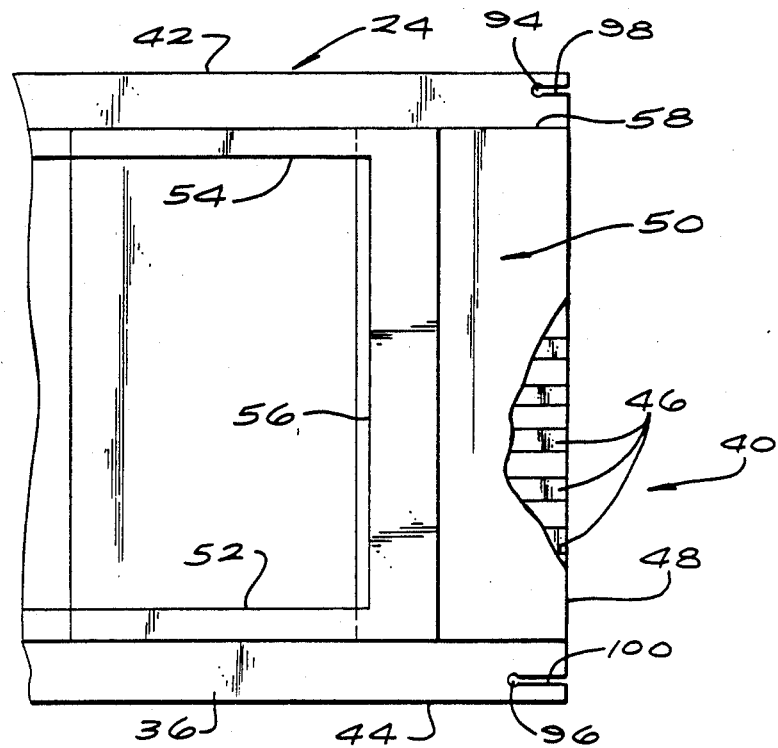
FIG. 4 is a bottom view of the end portion of the movable flexible circuit member of the assembly illustrated in FIGS. 1 to 3, with a portion of the insulation flap thereon cut away to show the bared conductive layers in the contacting area at the end of the member.
Figure 5:
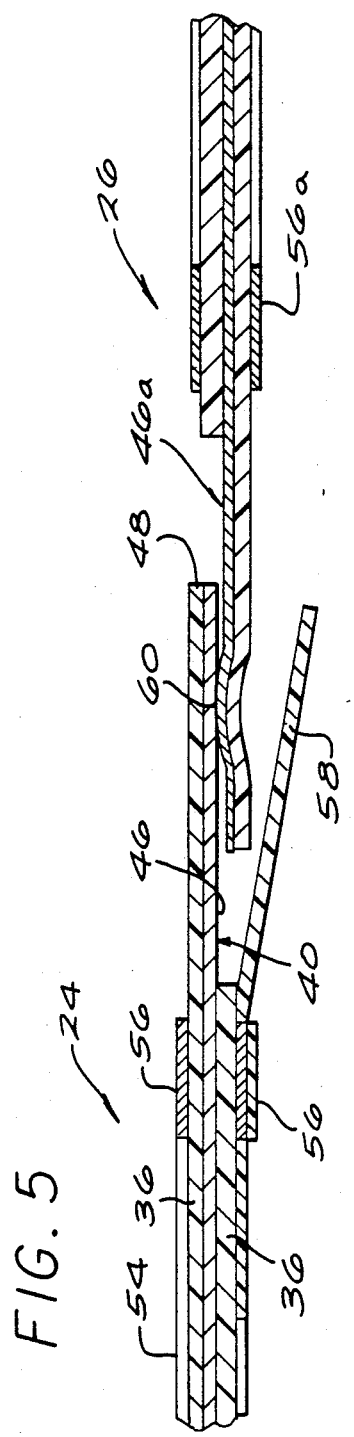
FIG. 5 is a longitudinal sectional view through the two circuit members in the position in which they are assembled prior to being mounted in the connector of the connection assembly.

As best seen in FIGS. 2 and 4, the movable flat cable 24 comprises an elongated insulative sheet 36 having spaced parallel conductive layers 40 therein spaced inwardly from the sides 42 and 44 of the sheet. The conductive layers may be metal strips, conductive traces or the like. As best seen in FIG. 5, the conductive layers are embedded within the sheet 36. The conductive layers 40 of the flat cable are bared on one surface of the cable, as indicated at 46, in the border region of the cable adjacent to its end 48 to form a contacting area 50 of the cable.

As is common in the art, the flat cable 24 is provided with an EMI. RFI, EMP shield on its opposite surfaces, formed by exposed conductive layers 52 and 54 running along the sides of the cable outside of the conductive layers 40 and a transverse conductive layer 56 joined to the layers 52 and 54 immediately behind but spaced from the area 50 of contacting the cable.

As best seen in FIGS. 4 and 5 an insulation flap 58 is adhered to the cable 24 under the layer 56 of the conductive shield on the bottom of the cable. Alternatively, the rear of the flap could terminate in front of the shielding layer 56. The flap 58 extends forwardly to the end 48 of the cable so as to cover the bared conductive layers 46 of the cable, yet the flap is loose so as to permit the end of the mating cable 26 to be inserted between the flap and the contacting area 50 of the cable 24 to permit connection between the conductive layers of the cables in a manner which will be described in further detail below.

The other flat cable 26 is similar to the cable 24, except that it is not provided with the flap 58, and the bared conductive layers 46a of the cable are deformed to provide a raised section 60 in the contacting area of the cable, which provides a higher contact force between the by the connector 22.

The connector 22 comprises a base 62 and a cover or pressure plate 64, which may be formed either of an insulation or a conductive material. A conductive material would be preferable for shielding purposes, at least on the outer surface of the base and cover. The base 62 is formed with vertical holes 66 in the four corners of the base for facilitating mounting of the base onto a support, not shown. Threaded holes 68 are formed in the base between the holes 66 along the sides of the base. A channel 70 extends transversely across the base in which there is mounted an elastomeric support layer 72. The layer is formed with an elongated raised rib 74 which underlies the contacting areas of the cables 24 and 26 when the cables are mounted in the connector.

Figure 6:
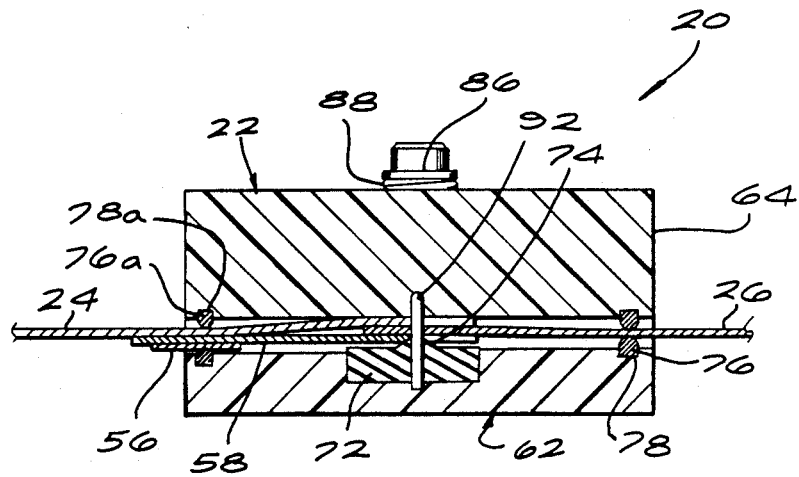
FIG. 6 is a sectional view taken along line 6—6 of FIG. 1 showing how the circuit members are mounted in the connector.

A bead of conductive elastomer 76 is mounted in a rectangular channel 78 formed in the upper face of the base 62 completely surrounding the central rectangular area 80 of the base which receives the end portions of the cables 24 and 26, as best seen in FIG. 6. A similar bead 76a is mounted in a rectangular channel 78a in the bottom face of the cover. The conductive beads provide EMI, RFI and EMP shielding as will be exPlained later herein.

The cover 64 of the connector is dimensioned to overlie the base 62. The cover has openings 82 therein adjacent to its opposite sides which are aligned with the threaded holes 68 in the base. A shoulder screw 84, having a washer 86 thereon and a spring 88 mounted below the washer, is mounted through the hole 82, and is threaded at its end into a corresponding hole 68 in the base for applying a resilient clamping force between the cover and the base. Thus, the connector of the invention forms a clamping means for resiliently holding the contacting areas of the cables 24 and 26 in engagement with each other.

Two upstanding polarizing pins 90 and 92 are mounted on the base 62 of the connector. The pins are offset from each other along the longitudinal extent of the cables 24 and 26. The pins extend upwardly through the elastomeric support layer 72. The pin 92 is located in the center of the raised rib 74 and the pin 90 is located to the right side of the rib as viewed in FIG. 2.

As best seen in FIGS. 2 and 4, the insulation sheet 36 of the flat cable 24 is formed with circular polarizing openings 94 and 96 adjacent to the respective sides 42 and 44 of the sheet. The openings have a diameter slightly greater than that of the pins 90 and 92 so that the openings can slidably receive the pins therein. The openings 94 and 96 are adjacent to the end 48 of the cable but are spaced from such end different distances, the opening 94 being located behind the end 48 a distance greater than the opening 96. It should be noted that in FIG. 4, the cable 24 is shown in an inverted position as compared to that illustrated in FIG. 2, so that the opening 94 in FIG. 2 is located at the bottom of the cable, whereas in FIG. 4 it is located at the top of the cable. A slot 98 is formed in the flexible sheet 36 of the cable extending from the opening 94 to the end 48 of the cable. A similar slot 100 extends from the opening 96 to the end of the cable. The width of each slot 98 and 100 is less than the diameter of the corresponding opening and polarizing pin so that engagement of the pin with the edge of the opening adjacent to the slot will provide some resistance to withdrawal of the cable 26 from the connector. Yet, by the provision of the slots, separation resistance of the cable 24 from the connector is relatively low. Further, the slots prevent tearing of the insulation sheet 36 upon separation, which would otherwise occur if the slots were not provided.

The openings 94 and 96 in the cable 24 are offset the same distance as are the polarizing pins 92 and 90, respectively, so that when the cable 24 is mounted over the base in its proper orientation, the pin 90 will enter the opening 96 and the pin 92 will enter the opening 94.

The flat cable 26 is also formed with offset polarizing openings 94a and 96a which are spaced behind the end 48a of the cable, but are not connected thereto by slots as in the cable 24. When the cable 26 is properly oriented for mounting in the connector 22, the polarizing pin 90 enters the opening 94a in the cable 26 and the pin 92 enters the opening 96a in the cable. When the ends of the cables are mounted over the base in the manner just described, the respective bared layers 46 and 46a will be facing each other and will be aligned with each other for making electrical connection therebetween.

To assemble the connection assembly 20 initially the end portion of the cable 26 is inserted between the forward end portion of the cable 24 and the flap 58 as illustrated in FIG. 5, with the holes 94 and 96 in the cable 24 generally aligned with the holes 96a and 94a, respectively, in the cable 26. Cable 26 is inverted relative to the cable 24 so that the raised sections 60 of the bared conductive layers 46a of cable 26 face the bared conductive layers 46 of the cable 24. With the two cables assembled in this position, they are mounted over the base 62 of the connector so that the polarizing pins 90 and 92 will pass through the matching openings 94, 96a, and 96, 94a, respectively, in the two cables. Thereafter, the cover 64 is mounted over the cables on the base 62, to form a sandwich of circuit members or cables 24, 26 between cover and base clamping parts. Then, the screws 84 are threaded into the holes 68 in the base compressing the springs 88, thereby providing a resilient pressure force pressing the contacting areas of the two cables into engagement with each other. By this arrangement, a good electrical connection is provided between the bared conductive layers of the two cables.

The connector 22 resiliently holds the contacting areas of the flat cables 24 and 26 in engagement with each other with sufficient force to make electrical contact between the bared conductive layers 46 and 46a on the cables, but with a force sufficiently low to permit the cable 24 to be withdrawn laterally from the connector. The polarizing arrangement of the present invention, including the offset polarizing pins 90 and 92 cooperating with the offset polarizing openings 96 and 94 in the cable 24 and openings 94a and 96a in the cable 26, eliminates the possibility of incorrect polarization of the cables when mated. Further, the offset polarizing pins insures that a mechanical mismatch of the ends of the cables is readily apparent to the assembler of the connection assembly, thus assuring that the assembler will correctly orient the cables in the connector. The provision of the slots 98 and 100 in the cable 24 communicating with the polarizing openings 94 and 96 provides decreased separation resistance between the cable 24 and the connector, and prevents tearing of the insulation sheet of the cable. Only the material of the insulation sheet bordering the edges of the slots 98 and 100 will deform when the cable 24 is withdrawn from the connector.

Preferably, the polarizing holes 94a and 96a in the cable 26 are plated through so as to provide resistance to the cable pulling out of the connector upon separation of the cable 24 from the connector. Further, the raised contact area 60 of the cable 26 provides added resistance to pullout during separation of the cable 24. The increased separation resistance thus provided for the cable 26 and the decreased separation resistance provided by the slots 98 and 100 in the cable 24 eliminates the necessity for originally fixedly mounting the connector on a support. Thus, it is possible by the present invention to allow the connector 22 to hang freely, if desired, and still achieve proper launch separation of the cable 24 from the connector and circuit integrity.

When the cables 24 and 26 are fully installed in the connector 22 as shown in FIGS. 1 and 6, the conductive beads 76 and 76a on the base 62 and cover 64 respectively are in contact with the flexible circuit shielding layers 56 and 56a on the two cables. The resilient clamping force provided by the screws 84 and springs 88 assures that the conductive beads 76 and 76a are forced into intimate contact with each other along the sides 32 of the connector and with the shielding layers 56 and 56a to provide uninterrupted EMI, RFI, EMP shielding and environmental protection for the overlapping contacting areas of the cables in the connector.

When the cable 24 is forceably withdrawn from the connector at the time of launch of a vehicle attached to the cable, the insulation flap 58 overlying the contacting areas of the mating cable ends will be forced against the bared conductive layers 46 of the cable 24 as it is drawn through the conductive elastomeric beads 76 and 76a, thereby preventing contact between the bead 76 and such conductive layers. This eliminates any separation-event shorting between the circuits in the launching vehicle.

Figure 7:
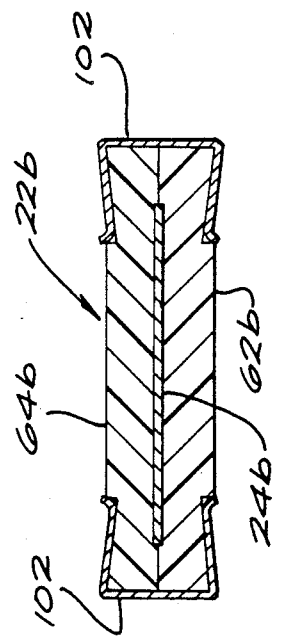
FIG. 7 is a transverse sectional view through an alternative form of the connector of the present invention employing spring clamps for holding the cover to the base of the connector.

Reference is now made to FIG. 7 of the drawings which shows a modified form of the connector 22b of the present invention, in which the base 62b and cover 64b of the connector are held together by U-shaped spring clamps 102. In FIG. 7, one of the cables mounted on the connector is shown in cross-section, and indicated by reference numeral 24b.

Figure 8:
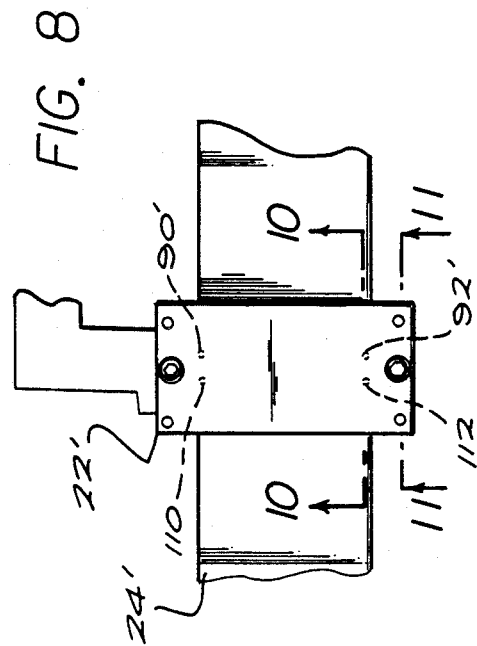
FIG. 8 is a plan view of another embodiment of the flexible circuit connection assembly of the present invention in which three flexible circuit members are interconnected by the connector of the assembly.
Figure 9:
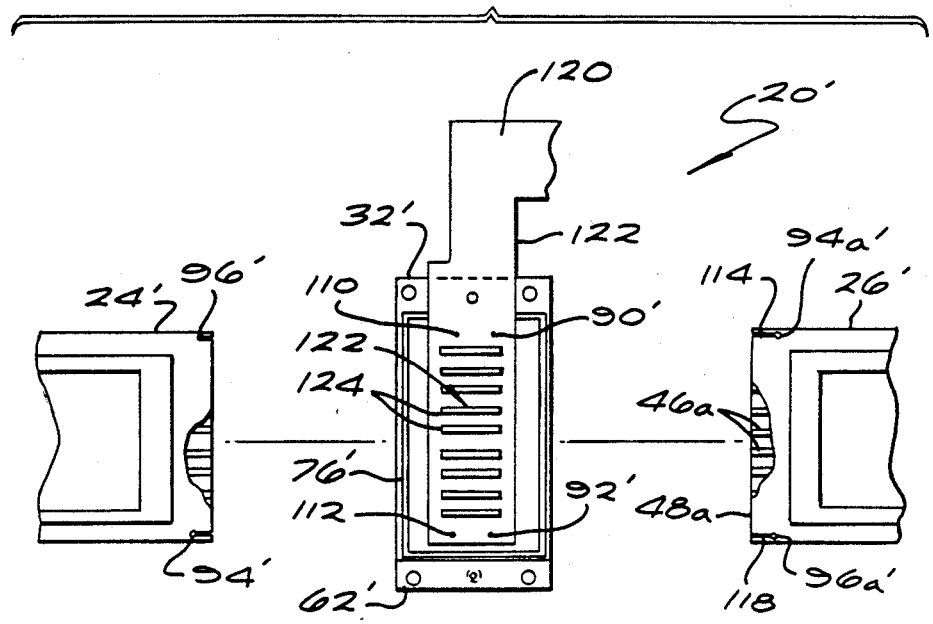
FIG. 9 is an exploded view of the assembly illustrated in FIG. 8, with the cover of the connector removed.
Figure 10:
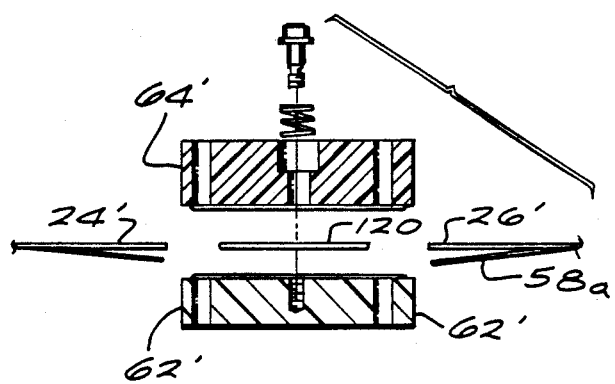
FIG. 10 is a sectional view taken along line 10—10 of FIG. 8, with the parts of the connection assembly separated from each other.

Reference is now made to FIGS. 8 to 10 of the drawings which show a further embodiment of the connection assembly of the present invention of a "T" type design which may be utilized for allowing two flexible circuit members or flat cables to be pulled away from the connector which contains a contact strip electrically connected to a third circuit member. In this embodiment, the basic structure is as previously described and like numbers primed are used to indicate like or corresponding parts. The cable 24' and the connector 22' may be the same as that shown in FIGS. 1 to 6, except that the base 62' is provided with two sets of polarizing pins 90', 92'and 110, 112. The flat cable 26' differs from the cable 26 in that slots 114 and 118 extend from the polarizing pin receiving openings 94a' and 96a' to the end 48a' of the cable, which allows separation of the cable 26' from the connector in the same manner as the cable 24'. Further, in contrast to the cable 26, the cable 26' in the embodiment 20' of the connection assembly is inverted so that the conductive layers 46a' face downwardly, and the cable is provided with an insulation flap 58a' similar to the flap on cable 24'.

Figure 11:
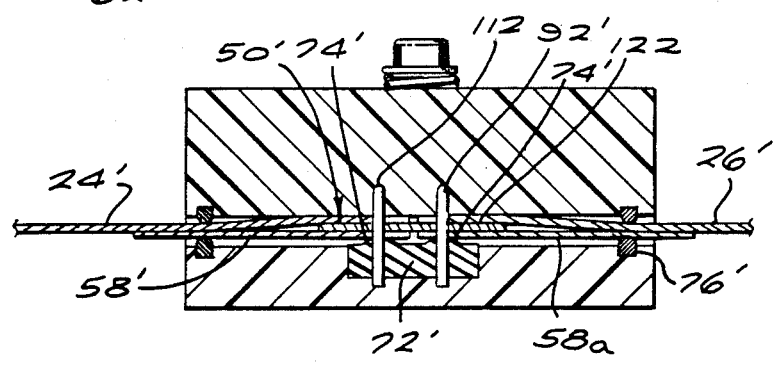
FIG. 11 is a sectional view taken along line 11—11 of FIG. 8 showing how the three circuit members are interconnected by the connector of the assembly.

The connection assembly 20' includes a third circuit member 120, in the form of a flat cable. The cable 120 embodies a relatively narrow segment 122 which extends into the connector 22' through the side 32'. The circuit segment 122 embodies a row of spaced upwardly facing bared conductive layers 124 which are arranged in a pattern corresponding to the pattern of the conductive layers on the cables 24' and 26'. The polarizing pins 90', 92', 110 and 112 extend upwardly through corresponding openings in the circuit segment 122. As seen in FIG. 11, the contacting area 50' of the cable 24' overlies one-half of the circuit segment 122, with its insulation flap 58' underlying the circuit segment 122. Likewise, the contacting area of the cable 26' overlies the other half of the circuit segment 122, with the insulation flap 58a' underlying such segment. The polarizing pins 110 and 112 extend upwardly through the openings 96' and 94', respectively, in the cable 24', while the polarizing pins 90' and 92' extend upwardly through the polarizing openings 94a' and 96a', respectively, in cable 26'. Thus, the cables 24' and 26' lie in substantially the same plane over the circuit segment 122, with the respective insulation flaps underlying the circuit segment so that when the cables are withdrawn from the connector in opposite directions, the bared conductive traces on the contacting areas of the cables will not be shorted out by the conductive shielding bead 76' on the upper surface of the base 62'. Preferably, the elastomeric support layer 72' is widened so that it underlies the contacting areas of both flat cables, and is preferably formed with two raised ribs 74' for enhancing the electrical connection between the bared conductive layers of the cable 24' and 26' with the interconnecting conductive layers 124 of the cable 120. The conductive layers 124 of the cable 120 not only electrically interconnect the conductive layers of the two cables 24' and 26', but also may be connected to external circuits via additional conductive strips, not shown, of the cable 120.

Thus, the connection assembly 20' functions in a manner similar to the assembly 20, except that both flat cables 24' and 26' may be pulled away from the connector 22' due to the resilient clamping provided by the connector to the ends of the three cables. The insulation flaps 58' of the cables 24' and 26' avoid shorting of the conductive layers of the cables upon separation from the connector by isolating such conductive layers from the conductive shielding bead 76' on the base 62' of the connector.

Although several embodiments of the invention have been disclosed herein for purposes of illustration, it will be understood that various changes can be made in the form, details, arrangement, and proportions of the various parts in such embodiments without departing from the spirit and scope of the invention as defined by the appended claims.

What is claimed is:

1. A flexible circuit connection assembly comprising:
   a pair of circuit members having bared conductive layers thereon arranged in generally matching patterns on contacting areas on said members;
   said members being arranged in a position with said contacting areas overlapping and said conductive layers on said respective members facing each other and in substantial alignment with each other;
   at least one of said members being a flexible circuit having a flexible insulation sheet on which said conductive layers are disposed;
   clamping means for resiliently holding said contacting areas of said members in engagement with each other with sufficient force to make electrical contact between said respective conductive layers on said members, but with a force sufficiently low to permit said one member to be withdrawn laterally from said clamping means; and
   polarizing means for locating said members in said clamping means with said contacting areas overlapping in said position, said polarizing means comprising different length slots in said flexible insulation sheet of said one member opening at the end thereof, and offset upstanding pins on said clamping means extending through said slots and corresponding openings in the other of said circuit members.

2. A connection assembly as set forth in claim 1 wherein:
   said pins are cylindrical; and
   the bottoms of said slots are formed as enlarged openings receiving said pins; and
   the width of said slots from said enlarged openings to said end of said one member being less than the diameters of said pins, the material of said sheet adjacent to said slots being deformed by said pins when said one member is withdrawn from said clamping means.

3. A connection assembly as set forth in claim 1 wherein:
   said other member is fixedly retained in said clamping means by said pins.

4. A connection assembly as set forth in claim 1 including:
   a third of said circuit members comprising a flexible circuit having a flexible insulation sheet with bared conductive layers on a contacting area thereof, said conductive layers of said third member being arranged in a pattern generally matching said first-mentioned pattern;
   said third member being generally aligned lengthwise and coplanar with said one member, and located in a second position with said contacting area thereof overlapping said contacting area of said other member, with said conductive layers of said third member facing said conductive layers on said other member and in substantial alignment therewith;
   said clamping means resiliently holding said contacting area of said third member in engagement with said contacting area of said other member with sufficient force to make electrical contact between said respective conductive layers on said other and third members, but with a force sufficiently low to permit said third member to be withdrawn laterally from said clamping means.

5. A connection assembly as set forth in claim 4, including:
   second polarizing means for locating said third member in said clamping means with its contacting area in said second position, said polarizing means comprising different length slots in said flexible insulation sheet of said third member opening at the end thereof, and additional offset upstanding pins on said clamping means extending through said slots in said flexible insulation sheet of said third member and corresponding additional openings in said other member.

6. A connection assembly as set forth in claim 5 wherein:
   said clamping means includes two ends and opposed sides;
   said one member and said third member extends into said clamping means through said ends thereof; and
   said other member extends into said clamping means through one of said sides thereof.

7. A connection assembly as set forth in claim 4 wherein:
   said other member embodies a relatively narrow segment extending into said clamping means transverse to the longitudinal extent of said one member and said third member; and
   said conductive layers of said third member comprising a row of relatively short conductive traces.

8. A connection assembly as set forth in claim 1 wherein:

said members are elongated, flexible circuits which are generally aligned with each other.

9. A connection assembly as set forth in claim 8 wherein:
said openings in said other circuit member receiving said pins are spaced from the end of said other circuit member whereby said pins retain said other circuit member in said clamping means when said one member is withdrawn therefrom.

10. A connection assembly as set forth in claim 1 wherein:
said clamping means comprises a base and a cover having opposed surfaces;
said one member enters said clamping means through one end thereof;
conductive shielding means on at least one of said surfaces, adjacent to at least said one end of said clamping means;
said bared conductive layers on said one member facing said one surface;
said one member having an insulation flap on the surface thereof having said bared conductive layers thereon;
said contacting area of said other member being disposed between said flap and said one member in said clamping means: and
when said one member is withdrawn from said clamping means to separate from said other member said flap covers said bared conductors on said one member to prevent contact between said conductors and said shielding means.

11. A flexible circuit connection assembly comprising:
a pair of circuit members having bared conductive layers thereon arranged in generally matching patterns on border regions along adjacent ends thereof.
at least one of said members being a flexible circuit having a flexible insulation sheet on which said conductive layers are disposed;
support means for said border regions of said circuit members;
conductive shielding means on said support means underlying said border regions;
said members being arranged with said border regions overlapping and said conductive layers on said respective members facing each other and in engagement with each other;
said one member having an insulation flap on the surface thereof having said bared conductive layers thereon, said flap extending substantially to said end of said one member so as to cover said bared conductive layers when said other member is separated from said one member;
said one member being movable laterally from said support means to separate said members whereby said flap covers said bared conductors on said one member to prevent contact between said conductive layers on said one member and said shielding means.

12. A flexible circuit connection assembly comprising:
a pair of circuit members having bared conductive layers thereon arranged in generally matching patterns on border regions along adjacent ends thereof;
at least one of said members being a flexible circuit having a flexible insulation sheet on which said conductive layers are disposed;
said members being arranged with said border regions overlapping and said conductive layers on said respective members facing each other and in engagement with each other;
said one member having an insulation flap on the surface thereof having said bared conductive layers thereon, said flap extending substantially to said end of said one member so as to cover said bared conductive layers when said other member is separated from said one member;
a base and a cover on opposite sides of said border regions of said members;
means associated with said base and said cover resiliently holding said border regions in engagement with each other with sufficient force to make electrical contact between said respective conductive layers on said members, but with a force sufficiently low to permit said one member to be withdrawn laterally from said base and cover;
said base and cover having opposed surfaces; and
conductive shielding means on at least one of said surfaces extending around the area of said overlapping border regions of said members.

13. A circuit connection assembly comprising:
first and second circuit members, each having a layer of insulation and a conductive layer forming a plurality of conductors on said layer of insulation, said circuit members each having a border region and said conductors being bare and arranged in matching patterns at said boarder regions;
said border regions of said circuit members lying in overlapping and adjacent positions;
clamping parts lying on opposite sides of said circuit member border regions to sandwich said border regions between said clamping parts to thereby form a sandwich of said circuit member border regions and said clamping parts, said clamping parts being pressed together with sufficient force to press said conductors of said circuit member into contact, but with a low enough force to enable said first element to be pulled out of said sandwich;
said first circuit member having a flap of insulative material, said second circuit member border region lying between said flap and said conductive layer of said first circuit members, said flap being held solely by the pressure of said clamping parts, and said flap pulls out of said sandwich with the rest of said first circuit member, whereby said flap covers said conductive layer of said first circuit member when the border region of said first member no longer overlaps the border region of said second circuit member.

14. The assembly described in claim 13 wherein:
said layer of insulation of said first circuit member has opposite sides and an end, and has a pair of slots lying near said opposite sides with each slot extending to the extreme end of the layer of insulation, and with each slot having an inner end furthest from said extreme end of said layer of insulation;
said sandwich of said circuit members and clamping parts includes a pair of pins coupled to at least one of said elements and projecting through a different one of said slots, said slots being of different lengths and said pins being positioned so each projects through the inner end of a corresponding slot, whereby said pins avoid accidental installation of said first member in an upside-down position.

* * * * *